(12) United States Patent
Sharp et al.

(10) Patent No.: US 10,746,768 B2
(45) Date of Patent: Aug. 18, 2020

(54) SYSTEM AND METHOD FOR DETECTING THEFT OF ELECTRICITY

(71) Applicant: Cooper Technologies Company, Houston, TX (US)

(72) Inventors: Michael McClintock Sharp, Plymouth, MN (US); Perry Lynn Baesler, Maple Grove, MN (US); Jay Edward Tolle, St. Louis Park, MN (US); Aaron Thomas Beckius, Minnetonka, MN (US); Garrett DeZeeuw, Albertville, MN (US)

(73) Assignee: Eaton Intelligent Power Limited, Dublin (IE)

( * ) Notice: Subject to any disclaimer, the term of this patent is extended or adjusted under 35 U.S.C. 154(b) by 297 days.

(21) Appl. No.: 15/622,322

(22) Filed: Jun. 14, 2017

(65) Prior Publication Data

US 2018/0364286 A1    Dec. 20, 2018

(51) Int. Cl.
*G01R 22/06* (2006.01)
*G01D 4/00* (2006.01)
*G01R 19/00* (2006.01)
*G01R 19/14* (2006.01)
*G06Q 50/06* (2012.01)

(52) U.S. Cl.
CPC .......... *G01R 22/063* (2013.01); *G01D 4/004* (2013.01); *G01R 19/0092* (2013.01); *G01R 19/14* (2013.01); *G01R 22/066* (2013.01); *G06Q 50/06* (2013.01)

(58) Field of Classification Search
CPC .. G01R 22/063; G01R 19/0092; G01R 19/14; G01R 22/066; G01D 4/004; G06Q 50/06
See application file for complete search history.

(56) References Cited

U.S. PATENT DOCUMENTS

| | | | |
|---|---|---|---|
| 6,020,734 A * | 2/2000 | Grisham | G01R 21/1338 324/103 R |
| 2007/0055889 A1 | 3/2007 | Henneberry et al. | |
| 2007/0179726 A1* | 8/2007 | Bickel | G01D 4/002 702/69 |

(Continued)

FOREIGN PATENT DOCUMENTS

CN            101477185 A      7/2009

*Primary Examiner* — Akm Zakaria
(74) *Attorney, Agent, or Firm* — Ziolkowski Patent Solutions Group, SC

(57) ABSTRACT

A system for detecting theft of electricity from a utility includes a controller configured to receive electricity readings from an upstream metering device configured to sense electricity flowing therethrough and electricity readings from a first downstream metering device that is electrically downstream from the upstream metering device and configured to sense electricity flowing to a first load. The controller is further configured to compare the electricity readings from the first downstream metering device to the electricity readings from the upstream metering device. The controller is additionally configured to calculate a level of interference with an electrical path through the upstream metering device based on an extent that the electricity readings from the first downstream metering device deviate from the electricity readings from the upstream metering device and to output to the utility the level of interference with the electrical path.

20 Claims, 5 Drawing Sheets

(56) References Cited

U.S. PATENT DOCUMENTS

| | | | |
|---|---|---|---|
| 2007/0247789 A1* | 10/2007 | Benson | G01D 4/006 |
| | | | 361/672 |
| 2008/0109387 A1 | 5/2008 | Deaver et al. | |
| 2010/0235144 A1* | 9/2010 | Mosberger-Tang | G01D 4/004 |
| | | | 702/188 |
| 2014/0358838 A1 | 12/2014 | Dhurandhar et al. | |
| 2015/0241488 A1* | 8/2015 | Sonderegger | G01R 22/066 |
| | | | 702/65 |
| 2016/0161539 A1* | 6/2016 | Kraft | G01R 22/066 |
| | | | 324/110 |
| 2017/0039372 A1* | 2/2017 | Koval | H04W 4/38 |
| 2017/0074913 A1 | 3/2017 | Saito et al. | |

* cited by examiner

SYSTEM AND METHOD FOR DETECTING THEFT OF ELECTRICITY

BACKGROUND OF THE INVENTION

The present invention relates generally to electricity theft detection and, more particularly, to a system and method of detecting theft of electricity using advanced metering infrastructure including electric sub-meters.

Theft of electricity is a serious problem worldwide. Electricity theft has become the third largest form of theft behind credit card data theft and automobile theft. In 2014, worldwide losses as a result of stolen electricity amounted to 89.3 billion dollars. Electricity theft losses in the United States amount to approximately 6 billion dollars every year. Approximately 80% of electricity theft is residential, with the remaining 20% of electricity theft being commercial. Electricity theft is one of the most prominent, if not the most prominent, form of non-technical losses. Non-technical losses are caused by actions external to a utility's power distribution system or caused by loads and/or conditions not taken into account in the computations for the power distribution system technical losses (naturally occurring or internal losses from power dissipation).

A variety of methods are used by utility customers to steal electricity from electric utilities. Many of the methods involve tampering with the primary meter that reads the electricity flowing into the residential or commercial load. One way to tamper with older meters is to pull out the meter that connects the electrical path from the utility to the electrical path into the property and put that meter back in upside down. Thus, the line side of the meter and the load side of the meter would be reversed, and the meter would record any measurements taken as a reverse flow of electricity. In other words, the meter would read that electricity is being provided to the utility from the load. Another way utility customers tamper with their utility meters is to put a shunt in the base of their meter to create a parallel electrical path that will not be monitored. Yet another common meter tampering method is to put one or more magnets on the meter. The magnets cause the meter to rotate slower than intended, resulting in a lower electric bill.

Utility customers also steal electricity from electrical utilities by tampering with the electrical lines leading into the property. Many utility customers bypass the meter within the meter housing by connecting a wire at the line side or input of the meter directly to the load side or output of the meter. In addition, some customers bypass their meters simply by tapping into an overhead power line on or near the property using a fish hook or similar device to bypass the meter. Other customers dig up underground power lines on their property and tap directly into those lines.

In any case, tampering with electric utility meters or power lines is dangerous and illegal. The traditional methods of detecting electricity theft include going to a customer's property to look for physical indications of tampering, gathering leads reported by the public, and investigating neighbors and relatives of customers found to be tampering to determine if they are also tampering. However, those methods are time consuming and expensive, so electric utilities developed methods of remotely detecting tampering. Several methods include monitoring meters for reverse flow events; power outages and blinks; load side voltages upon disconnecting power; magnetic detection using a Hall effect switch or a similar device; vibration or tilting of the meter; meter cover removal; and incorrect polyphase wiring. Further, transformers that feed primary meters electrically downstream therefrom may also be monitored so that the electricity or power readings at the transformer may be compared against the aggregated usage reported by the meters.

In addition to the above, substation feeder metering and advanced metering infrastructure (AMI) data may be incorporated into a power distribution model for the electric utility in order to determine the feeders with the greatest non-technical loss. Also, changes in current flow patterns may be detected before using thermal imaging to find overloaded transformers. Data analytics can be used to locate large spikes or drop offs from historical usage patterns at homes or commercial buildings. The data analytics can account for weather patterns, billing/payment information, comparisons to neighborhood consumption patterns, transformer to aggregate load comparisons, and various other factors.

While the above methods may be helpful in determining whether a customer is stealing electricity, those methods cannot perfectly determine whether electricity theft is occurring. None of the methods take advantage of every indicator of electricity theft. For example, none of the above methods monitor components downstream from the primary meter for indications of theft. In addition, the above methods only provide raw data that must be interpreted by the utility in order to determine how likely it is that electricity is being stolen by a customer. Interpretation of that raw data is time consuming and may not provide an indication of electricity theft or may provide a false positive indication of threat when viewed in isolation, depending on various factors. The utility may have to send someone to investigate, even if there is a low likelihood of theft.

It would therefore be desirable to provide a system and method for electricity theft detection that takes advantage of additional data downstream from primary meters in a power distribution system and that indicates the likelihood of electrical theft by an electric utility customer using multiple data sources.

BRIEF DESCRIPTION OF THE INVENTION

Embodiments of the present invention provide a system and method for electricity theft detection in a power distribution system by monitoring sub-meters downstream from primary meters monitoring a utility customer's electricity usage and demand and by indicating the probability that a customer has been stealing electricity.

In accordance with one aspect of the invention, a system for detecting theft of electricity from a utility. The system includes a controller configured to receive electricity readings from an upstream metering device configured to sense electricity flowing therethrough and electricity readings from a first downstream metering device that is electrically downstream from the upstream metering device and configured to sense electricity flowing to a first load. The controller is further configured to compare the electricity readings from the first downstream metering device to the electricity readings from the upstream metering device. The controller is additionally configured to calculate a level of interference with an electrical path through the upstream metering device based on an extent that the electricity readings from the first downstream metering device deviate from the electricity readings from the upstream metering device and output to the utility the level of interference with the electrical path.

In accordance with another aspect of the invention, a method of detecting theft of electricity includes acquiring electrical data for a primary load using a primary meter and electrical data for a secondary load downstream from the primary load using a sub-meter and transmitting the electrical data for the primary and secondary loads to a controller. In addition, the method includes analyzing the electrical data for the primary and secondary loads with the controller to detect if any of the secondary load electrical data conflicts with the corresponding primary load electrical data. Furthermore, the method includes assessing with the controller an extent of tampering with an electrical line through the primary meter to the primary load based on the analysis and outputting the extent of the tampering with the electrical line to a display.

In accordance with yet another aspect of the invention, a power system having electrical theft detection capabilities includes a primary meter configured to measure a flow of electricity through an electrical path from an electric utility to a primary load and a control system for detecting theft of electricity. The control system configured to retrieve the electricity flow measurements of the primary meter and electricity flow measurements from at least one secondary meter electrically downstream from the primary meter, the at least one secondary meter configured to measure a flow of electricity to at least one secondary load and to compare changes in the electricity flow measurements of the primary meter to changes in the electricity flow measurements of the secondary meter taken at the same time. The control system is also configured to calculate a percentage of electricity that has bypassed the primary meter before being delivered to the primary load based on the comparison of changes in the electricity flow measurements of the primary meter to changes in the electricity flow measurements of the at least one secondary meter and to display the percentage on a graphical user interface.

Various other features and advantages of the present invention will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Embodiments of the invention relate to a system and method for detecting electricity theft in a power distribution system by comparing the electricity usage and demand data from a primary meter for a residential or commercial load and a sub-meter within the residential or commercial load and electrically downstream from the primary meter. If a significant difference is present between changes in the electricity usage and/or demand data for the sub-meter and changes in the electricity usage and/or demand data for the primary meter, an indication of tampering or that the primary meter has been partially bypassed is output to a GUI at the electric utility that owns the power distribution system. The indication of tampering may be displayed as a tampering or bypass percentage and/or as part of an integrity checks system that uses data and colors to indicate the status of various metering devices in the power distribution system. The statuses of the metering devices displayed on the GUI indicate or designate the probability that the metering devices have been bypassed or that utility customers have tampered with the metering devices.

Figure 1:
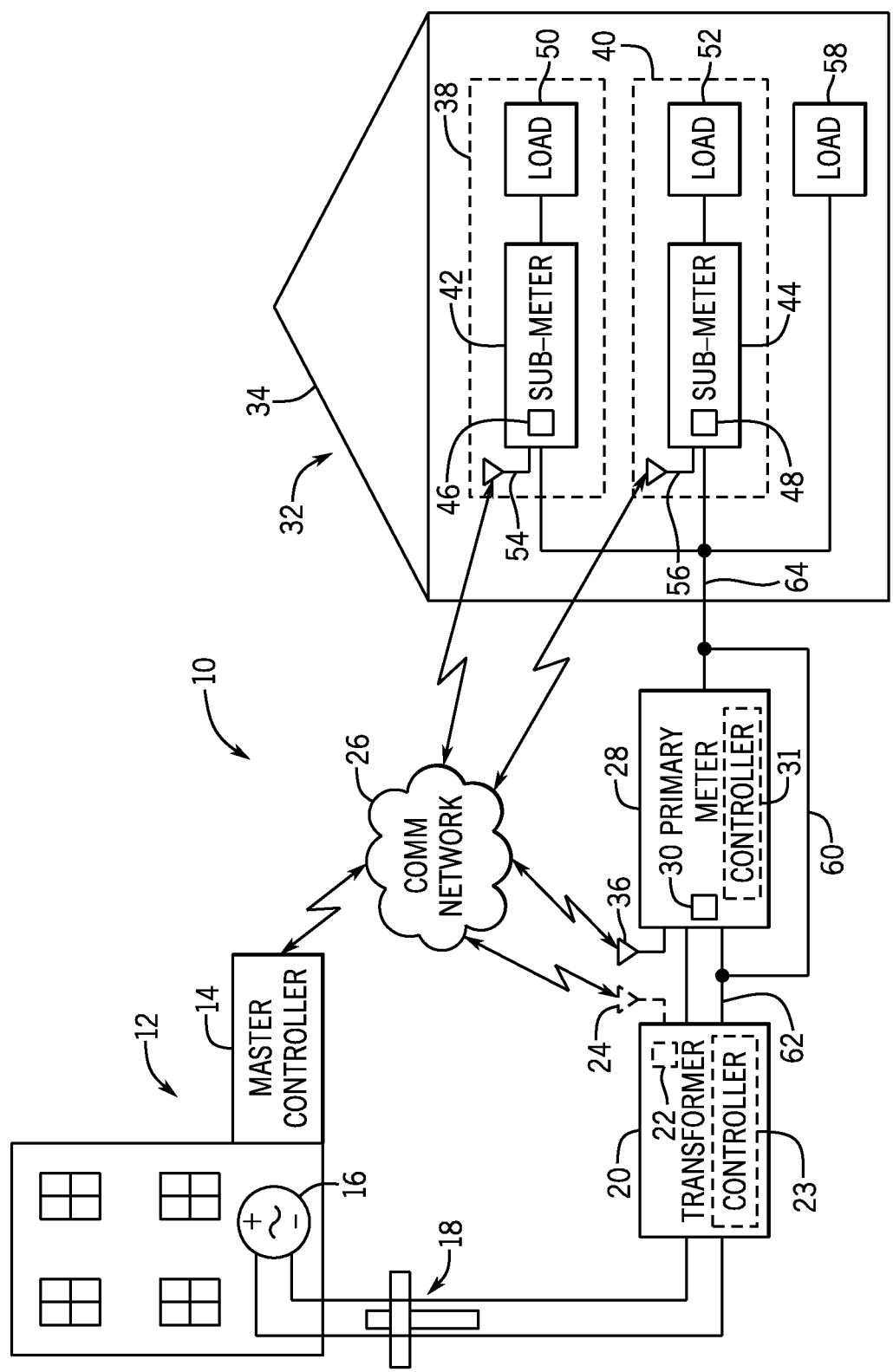
FIG. 1 is a diagram of a power distribution system including a system for electricity theft detection, according to an embodiment of the invention.

Referring to FIG. 1, a diagram of an electrical or power distribution system 10 of an electric utility is illustrated, according to an embodiment of the invention. Power distribution system 10 includes a master station 12. Master station 12 includes a master controller or control system 14 and an electrical power source 16. Power source 16 may include one or more power-generating facilities such as, for example, fossil fuel, hydro-electric, and nuclear power plants. Power distribution system 10 also includes a power distribution network 18 electrically connecting station 12 to a transformer 20 for distributing electricity produced by power source 16 to various loads of electrical system 10. Optionally, transformer 20 may be a smart transformer that includes a meter or sensor 22 for measuring or sensing the amount of electricity flowing therethrough and used by customers of the utility. Transformer 20 may also optionally include a controller or control system 23 and a transceiver 24 for sending electricity flow measurements to and receiving commands from controller 14 over a long-haul communications network 26 formed therebetween.

Long-haul communications network 26 may include a wireless network, as depicted in FIG. 1, or a wired network. As such, long-haul communications network 26 may use wired or wireless communications, telephonic communications, Internet Protocol-based communications, satellite system-based communications, and any other type of communications useful for communicating with the various components of electrical system 10. Examples of such communications systems includes ZigBee®, wireless mesh network, Wi-Fi, wireless point-to-multipoint tower-based, fiber, cellular, and Power Line Carrier. Long-haul communications network 26 generally has two-way communications abilities, which allow controller 14 to both send commands to and receive data from the various components of electrical system 10.

Transformer 20 delivers electricity to a primary electricity or power meter or metering device 28 having a sensor 30 for measuring or sensing the amount of electricity flowing therethrough in terms of energy used or consumed and power demanded or consumed at a property 32 having a residence 34, which is the primary load of property 32. Primary meter 28 also includes a transceiver 36 for sending electrical or electricity usage and demand data to and receiving commands from controller 14 over long-haul communications network 26. In various embodiments, primary meter 28 also includes a controller or control system 31. The electricity or energy usage data measured by primary meter 28 is used to calculate an electricity bill for property 32 over one or more intervals. The electricity demand data measured by primary meter is used to determine how much power is demanded or consumed by property 32 at any given time.

Primary meter 28 is shown here as the entire load for a property, but could also meter any energy and power that are then partially metered again further downstream. As a non-limiting example, primary meter 28 could be configured to meter only the energy used and power demanded by residence 34, but not a garage (not shown) on property 32. As another non-limiting example, primary meter 28 could be configured to meter a particular circuit within residence 34 that includes multiple loads. In addition, primary meter 28 is shown outside of residence 34, but may also be positioned within residence 34. As a non-limiting example, primary meter 28 could be a metered circuit breaker for residence 34. While property 32 is shown as a residential property including residence 34, property 32 may be a commercial property or another type of property having other types of buildings or facilities such as, for example, offices, restaurants, stores, movie theaters, or any other facilities that require electricity from electrical system 10.

In the illustrated embodiment, residence 34 has three secondary loads including two smart loads 38, 40. Smart loads 38, 40 may be any type of applicable residential equipment such as, for example, a smart appliance like a refrigerator, an oven, a hot water heater, or a dishwasher; a smart system like a smart heating, ventilation, and air conditioning system or a lighting system; or a circuit that is metered separately from the other circuits in the property, by, for example, a metered circuit breaker. However, smart loads 38, 40 will be referred to as smart appliances below. Smart appliances 38, 40 each include a respective secondary or sub-meter or metering device 42, 44 having respective sensors 46, 48 for measuring or sensing the amount of electricity flowing therethrough in terms of energy usage and power demanded by loads 50, 52 of smart appliances 38, 40, respectively. Sub-meters 42, 44 each also include a respective transceiver 54, 56 for sending the measured electrical or electricity flow data to and receiving commands from master controller 14 over long-haul communications network 26 or from controller 31 of primary meter 28 or controller 23 of transformer 20.

While sub-meters 42, 44 are shown as being integrated with smart appliances 38, 40, sub-meters 42, 44 may be separate devices positioned at a different location than loads 50, 52. As a non-limiting example, sub-meters 42, 44 may be located outside of residence 34 with primary meter 28. In addition, in various embodiments, both or one of sub-meters 42, 44 may be a demand response or load management device, such as, for example, a load control relay, that controls when electricity may flow to smart appliances 38, 40. Residence 34 may further include a plurality of non-smart household loads represented by a single load 58. It is recognized that the loads 50, 52, 58 illustrated in FIG. 1 are for illustrative purposes only and that a greater or lesser number of loads (and associated sub-meters) could be present in the residence 34.

As shown in FIG. 1, the utility customer at residence 34 is stealing electricity by bypassing primary meter 28 with an electrical or bypass line 60. Bypass 60 effectively shunts primary meter 28 by directly connecting an electrical or circuit path or line 62 of power distribution network 18 of the utility and an electrical or circuit path or line 64 of residence 34. By shunting around primary meter 28, the utility customer at residence 34 prevents primary meter 28 from reading the full amount of electricity flowing to residence 34, which will result in a lower electric bill for the customer. While bypass 60 is shown in FIG. 1 as connected between transformer 20 and primary meter 28 and between primary meter 28 and residence 34, bypass 60 may be connected in any manner to shunt primary meter 28 such as, for example, on the other side of transformer 20 or even entirely within a housing (not shown) of primary meter 28. In addition, another method of electricity theft may be used instead of bypass 60.

Even though primary meter 28 is shunted, sub-meters 42, 44 of smart appliances 38, 40 have not been shunted. Therefore, sub-meters 42, 44 will still read the electricity used and power demanded by respective smart appliances 38, 40 and transmit the readings to controller 14 at station 12. Controller 14 can use all of the electrical usage and power demand data gathered by meters 28, 42, 44 to determine if the utility customer at residence 34 is stealing electricity. As will be described in more detail below with respect to FIG. 2, controller 14 can compare the readings from sub-meters 42, 44 to the readings from primary meter 28 in order to determine if the readings from sub-meters 42, 44 are consistent with the readings from primary meter 28. In other words, controller 14 will analyze the readings to evaluate if there is a change in energy consumption or power demand at primary meter 28 and sub-meters 42, 44. When controller 14 detects discrepancies or conflicts between the readings such that the readings are inconsistent, controller 14 can alert the utility of electricity theft at residence 34. The utility can then take action against the electricity theft such as, for example, sending out a lineman to remove bypass 60 or to shut off the power to property 32. While controller 14 is described above as performing the analysis of the data gathered by meters 28, 42, 44, controller 31 of primary meter 28 may also perform the analysis upon receiving the data from sub-meters 42, 44 and alert the utility of any discrepancies via transceivers 36 and long-haul communications network 26. Controller 23 of transformer 20 may additionally be used to perform the analysis after receiving the data from meters 28, 42, 44 under various circumstances.

Figure 2:
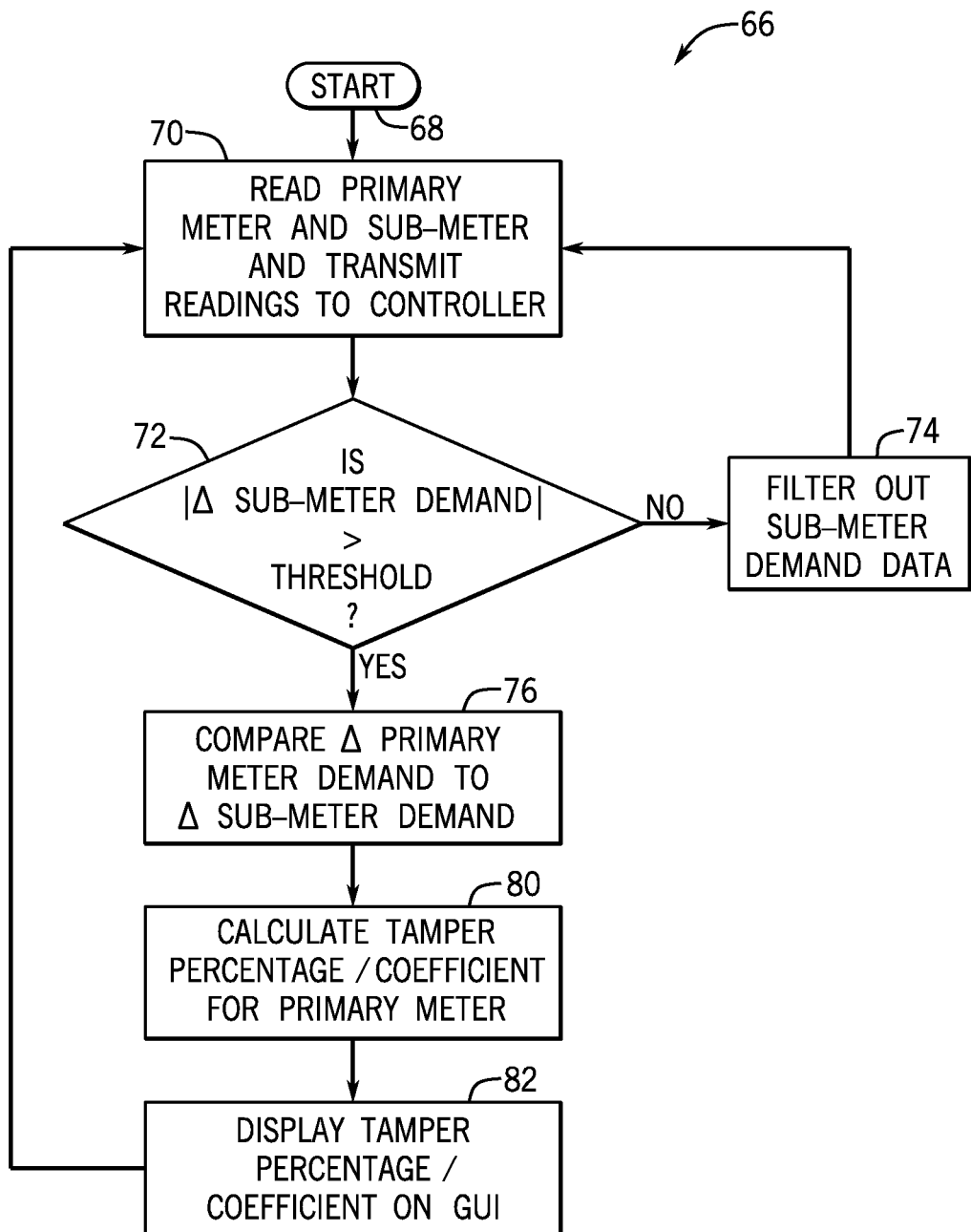
FIG. 2 is a flowchart illustrating a technique for detecting electricity theft in the power distribution system of FIG. 1, according to an embodiment of the invention.

Referring now to FIG. 2, and with reference back to FIG. 1, a technique or process 66 for detecting the electricity theft at property 32 and, more specifically, residence 34 is shown with process 66 being performed by a controller or control system in or associated with the utility, such as controller 14 of station 12 of the utility. Process 66 will be described below with respect to readings at primary meter 28 and sub-meter 42 with the analysis of the readings being performed by controller 14. However, as described above, the analysis of the readings at primary meter 28 and sub-meter 42 may instead be performed by controller 31 of primary meter 28 or controller 23 of transformer 20, with the results of the analysis being transmitted to controller 14. Process 66 may be used to monitor the energy consumption and power demand data obtained by primary meter 28 and sub-meter 44 separately from sub-meter 42 or may be used to monitor the electrical usage and demand data obtained by primary meter 28 and sub-meters 42, 44 collectively. Further, process 66 is not limited to being used to monitor two sub-meters and one primary meter. Process 66 may be used to monitor multiple transformers, primary meters, and sub-meters as needed within electrical system 10.

Process 66 begins at STEP 68 when electricity is provided to property 32 and residence 34 through transformer 20 and primary meter 28 and at least one electricity flow reading has been taken by primary meter 28 and sub-meter 42. At STEP 70, primary meter 28 reads the electricity usage and demand for property 32, and sub-meter 42 reads the electricity usage for load 50 of smart appliance 38. The readings taken by primary meter 28 and sub-meter 42 may occur over the course of one interval and be transmitted to controller 14 such that controller 14 monitors or analyzes the flow of electricity over one period of time. However, controller 14 may also analyze usage data collected over multiple intervals to calculate demand over different intervals to watch for changes in demand as load 50 turns on and off. That way controller 14 may incorporate historical data processing to present more complete and accurate results. At STEP 72, controller 14 determines whether the absolute value of a change in power demand or consumption measured by sub-meter 42 (|Δ sub-meter demand| in FIG. 2) at any point during the one or more intervals analyzed is greater than a deadband or predetermined minimum change in usage threshold or magnitude. In a non-limiting embodiment, the deadband is set to 25% of a maximum change in power consumption by load 50 of smart appliance 38. The deadband may be changed by the utility using controller 14 at any time.

If changes in demand measured by sub-meter 42 at any time during the one or more intervals analyzed is not greater than the predetermined threshold, controller 14 filters out the demand data for sub-meter 42 at those points in time with respect to the electricity theft detection analysis. In other words, any change in demand data sensed by sub-meter 42 that is not larger than the deadband is omitted from the electricity theft detection analysis. Controller 14 filters the demand data because it does not indicate a noteworthy or significant change in the demand at load 50 of smart appliance 38. Once controller 14 filters the demand data for sub-meter 42, process 66 returns to STEP 70, where controller 14 continues to receive readings from primary meter 28 and sub-meter 42.

If controller 14 determines at STEP 72 that the absolute value of any changes in demand measured by sub-meter 42 are larger than the minimum change in usage threshold, process 66 moves to STEP 76. At STEP 76, controller 14 compares changes in demand measured by primary meter 28 (Δ primary meter demand in FIG. 2) to changes in demand measured by sub-meter 42 (Δ sub-meter demand in FIG. 2) to determine whether there has been a change in power consumption by load 50 of smart appliance 38 without a corresponding change in power consumption measured by primary meter 28. That circumstance would indicate that load 50 is consuming more power, but primary meter 28 did not measure that same or a similar increase in power consumption for residence 34 overall. In that case, the power consumption of load 50 measured by sub-meter 42 has deviated from the power consumption for residence 34 measured by primary meter 28, which indicates a bypass of primary meter 28. After STEP 76, process 66 moves to STEP 80.

At STEP 80, controller 14 calculates a tamper, interference, or bypass percentage or coefficient corresponding to the level of tampering, interference, or bypass of the electrical path 62 through primary meter 28 assessed by controller 14. Controller 14 is generally configured or programmed to display a tamper percentage as a percentage of tampering and to display a tamper coefficient as a number between 0 and 1 proportional to the amounting of tampering. For example, in non-limiting embodiments, a tamper percentage of 20% would indicate that the utility customer has stolen 20% of the electricity used at residence 34, and a tamper coefficient of 0.8 would indicate the same. Thus, if no tampering is detected by controller 14 (in other words, no or a minimal number changes in demand at sub-meter are flagged by controller 14), the tampering coefficient should be close to 1 and the tampering percentage should be close to 0%. However, tamper percentages and coefficients may be displayed according to any desired format.

The tamper coefficient or percentage may be calculated by a variety of methods. In a non-limiting embodiment, the tamper coefficient may be calculated using a linear regression slope equation given by:

$$T = \frac{\sum (M_{SU\Delta} - \overline{M_{SU\Delta}})(M_{PU\Delta} - \overline{M_{PU\Delta}})}{\sum (M_{SU\Delta} - \overline{M_{SU\Delta}})^2},$$ [Eqn. 1]

where T is the tamper coefficient, $M_{SU\Delta}$ is the change in demand measured by sub-meter 42, $\overline{M_{SU\Delta}}$ is the average change in sub-meter demand, $\overline{M_{PU\Delta}}$ is the change in primary meter demand, and $\overline{M_{PU\Delta}}$ is the average change in primary meter demand. The tamper coefficient may be converted into the tamper percentage by simply subtracting the tamper coefficient from a value of 1 and multiplying the result by 100.

Once controller 14 calculates the extent that the utility customer has tampered with primary meter 28, controller 14 outputs the tamper coefficient and/or tamper percentage to a display at STEP 82 such as, for example, a GUI (not shown) at master station 12 of the utility. By displaying the tamper coefficient and/or percentage at the utility, controller 14 alerts employees of the utility that property 32 needs to be examined to fix the bypass of primary meter 28. Controller 14 will continue to output the tamper coefficient and/or percentage to the utility indicating the bypass of primary meter 28 until bypass 60 positioned around primary meter 28 has been removed. When bypass 60 has been removed, the tamper coefficient and percent would change to values more favorable to the utility. After controller 14 alerts the utility of the bypass, process 66 proceeds to STEP 70 to continue monitoring for electricity theft at property 32.

Figure 3:
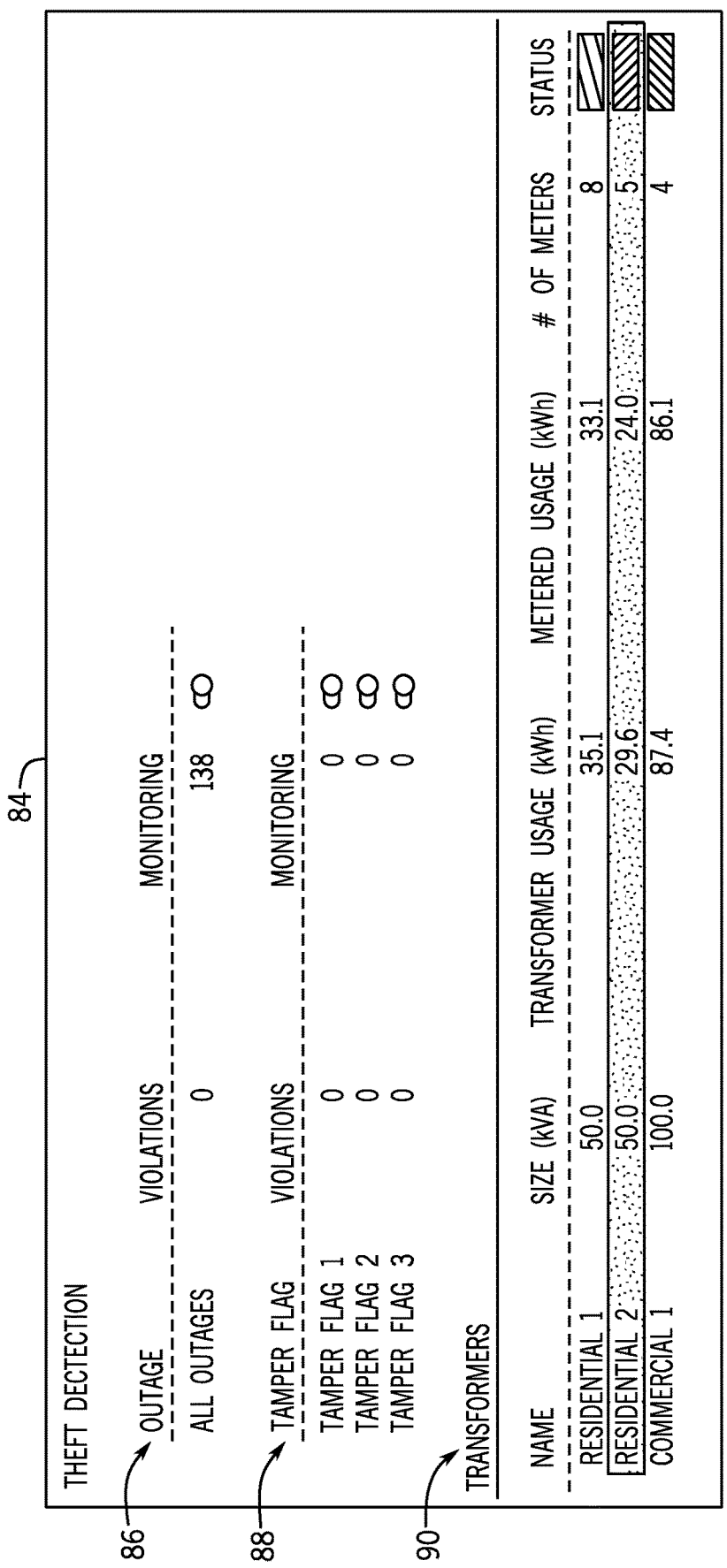
FIG. 3 is a screenshot of an exemplary graphical user interface (GUI) displaying the status of several transformers in a power distribution system based on an integrity checks analysis, according to an embodiment of the invention.
Figure 4:
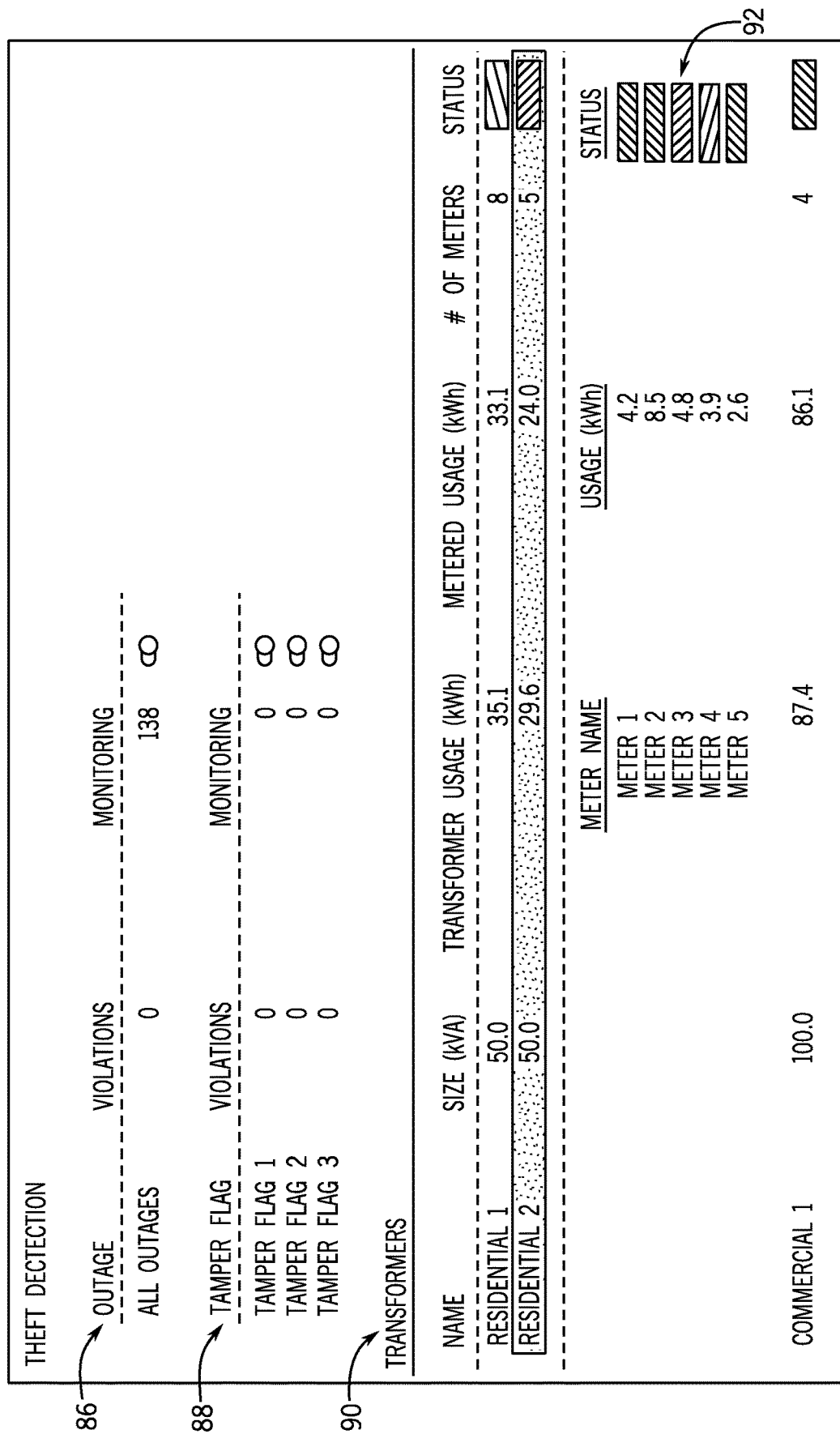
FIG. 4 is a screenshot of the exemplary GUI of FIG. 3 displaying the status of five meters electrically downstream from a residential transformer in the power distribution system based on the integrity checks analysis, according to an embodiment of the invention.
Figure 5:
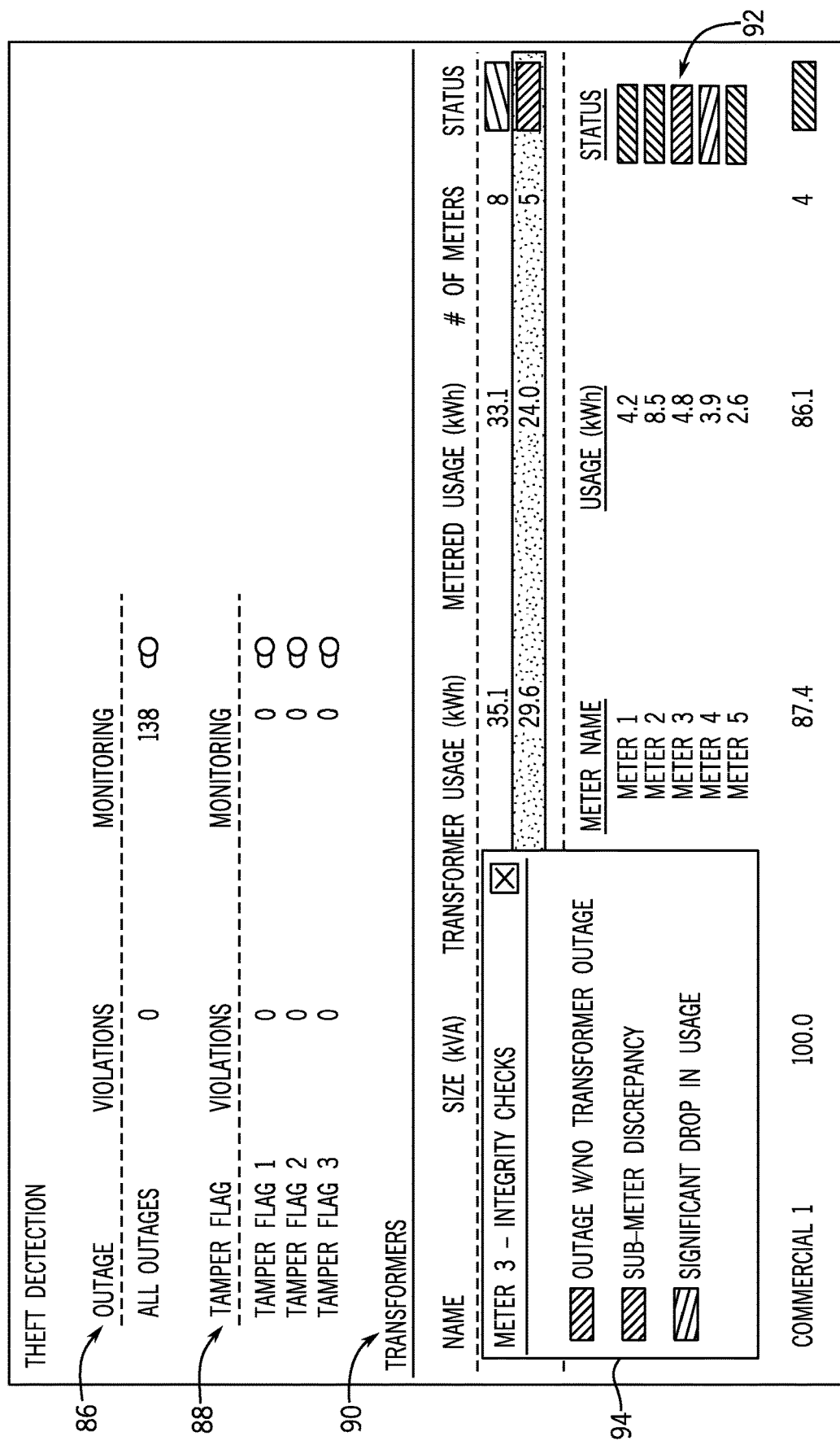
FIG. 5 is a screen shot of the exemplary GUI of FIGS. 3-4 displaying electricity theft indicators for one meter displayed in FIG. 4 based on the integrity checks analysis, according to an embodiment of the invention.

Referring now to FIGS. 3-5, screenshots of an exemplary GUI 84 displaying the status of several transformers and meters in a power distribution system, such as power distribution 10 of FIG. 1, based on an integrity checks analysis is illustrated, according to an embodiment of the invention. The integrity checks analysis is performed by a controller or control system, such as master controller or control system 14 of power distribution system 10 of FIG. 1, and may incorporate the electricity theft detection method of FIG. 2. The integrity checks analysis includes a variety of parameters that have various indications of the probability or likelihood that electricity is being stolen from a utility. The integrity checks analysis includes a scoring or ranking system that assigns a score or rank to each monitored trigger for an indication of theft.

In the non-limiting embodiment described in more detail below, the controller performing the integrity checks analysis assigns a predetermined number of points to each different type of theft indicator. The controller adds the number of points of each theft indicator associated with each monitored component in the power distribution system. The number of points will indicate whether there is no or essentially no probability of theft, a slight probability of theft, a medium probability of theft, or a high probability of theft affiliated with a monitored component. Any monitored components with no theft indicators associated therewith will have zero points. The controller uses the number of points associated with each monitored component to determine a status for each monitored component and then displays the status of each monitored component in the power distribution system on GUI 84. The controller displays each status as a color that indicates the probability that electricity is being stolen from the transformer. The colors are displayed based on a color-coded system in which green indicates no or essentially no probability of theft, yellow indicates a slight probability of theft, orange indicates a medium probability of theft, and red indicates a high probability of theft.

The indicators of theft monitored in the integrity checks analysis are generally divided into three different categories: slight probability, medium probability, and high probability indicators of theft. However, a different number of categories may be used based on preference. Typically, each category has a number of points assigned to it to indicate the probability of electricity theft, and the assigned number of points indicates the corresponding status. In other words, slight probability indicators are assigned a number of points to indicate a slight probability of theft by themselves, medium probability indicators are assigned a number of points to indicate a medium probability of theft by themselves, and high probability indicators are assigned a number of points to indicate a high probability of theft by themselves. The slight and medium probability indicators may be assigned a number of points so that it takes a specific number of slight and medium probability indicators to indicate the next level of probability of theft. As a non-limiting example, the slight probability indicators may be assigned a number of points so that it takes the existence of three slight probability indicators at a single monitored component to indicate a medium probability of electrical theft at that monitored component. However, each theft indicator may be assigned a different number of points regardless of whether they are in the same category. In addition, while the non-limiting embodiment of the integrity checks analysis described herein uses a points system, another system may be used to rank the various theft indicators.

Non-limiting examples of slight probability theft indicators may include the worst feeders for non-technical losses (determined using system modeling techniques with feeder and transformer metering and AMI data); existing outage flags for any monitored system components; zero consumption measured at system components over consecutive intervals; spikes or drops in usage, such as, for example, approximately 15% or more changes daily; and discrepancies found in comparisons between usage measured at a home and usage measured at similar neighboring homes. Medium probability theft indicators may include, for example, multiple outages over the course of a few or several days; outages followed by significant usage changes, such as a 15% or more daily reduction in consumption; and outages that are not widespread within a relatively short distance such as, for example, a half mile radius that may be based on global positioning system coordinates.

High probability theft indicators might include, as non-limiting examples, existing or available meter flags for events such as, for example, reverse flow, vibration and/or tilt, and magnetic detection; an outage at a meter downstream from a transformer, but other meters downstream from the same transformer are unaffected; the aggregated usage of downstream meters does not add up to the same usage at an upstream meter within an acceptable range; and a sub-meter on a smart apparatus or system or a load control relay, for example, experiences large changes in demand, but the primary meter upstream therefrom does not measure the same or a similar change in demand. The theft indicator of a large difference in demand change between upstream and downstream metering devices corresponds to process 66 of FIG. 2. The power distribution system controller compiles all electrical or electricity data for all of monitored system components; performs the integrity checks analysis using the data to determine any existing slight, medium, and high probability theft indicators; and outputs the status of the system components to GUI 84 to alert the utility. The electrical data with which the integrity checks analysis is performed generally includes all available data relating to power consumption, electricity usage, and electrical events or flags (such as, for example, outage, reverse flow, vibration/tilt, and magnetic/DC detection flags).

While many types of electricity theft indicators are listed above, additional or less indicators may be analyzed depending on the equipment available to the utility or the preference of the utility. In fact, it may be more advantageous to monitor theft indicators in the case where the high probability indicators, such as, for example, the large changes in demand between different meters monitored by process 66 of FIG. 2, are not analyzed. The high probability indicators are generally sufficient on their own to indicate theft of electricity, so the utility may use them separately from the integrity checks analysis when they are available. However, the high probability indicators are included in the description of GUI 84 below in order to provide a complete description of the integrity checks analysis.

As shown in FIGS. 3-5, the GUI 84 includes an outage section or portion 86, a tamper flag section or portion 88, and a transformer status section or portion 90, each including data from the integrity checks analysis. GUI 84 may include many other sections relevant to the integrity checks analysis depending on the characteristics of the power distribution system, the preference of the utility, and supporting technology. Outage section 86 of GUI 84 displays whether there are currently any outages within the associated power distribution system. In the case of FIGS. 3-5, the controller of the power distribution system is monitoring 138 system components, and none of those components are experiencing an outage violation. Tamper flag section 88 displays whether any of the system components are being monitored for tampering and if any tampering violations have occurred. Tampering violations may appear for any monitored instances of tampering with system components such as, for example, removing the cover of a transformer or primary meter and vibration and/or tilting of a transformer or primary meter. At the time of FIGS. 3-5, no system components are being monitored for tampering.

Transformer section 90 of GUI 84 displays select data for different monitored transformers. While transformer section 90 may include a multitude of transformers, the statuses of three transformers are displayed in transformer section 90 in FIGS. 3-5 for simplicity. Referring to FIG. 3, transformer section 90 displays data for two residential-use transformers, Residential 1 and Residential 2, along with one commercial-use transformer, Commercial 1. Transformer section 90 displays the size of each transformer measured in kilovolt-amperes (kVA), the usage at each transformer measured in kilowatt hours (kWh), the metered usage downstream from each transformer measured in kWh, the number of primary meters downstream from each transformer, and the status of each transformer. The status of each transformer is displayed as a color that indicates the probability that electricity is being stolen from the transformer based on the color-coded system described above. The status of each transformer is affected at least in part by the status of each meter downstream therefrom, as described in more detail with respect to FIGS. 4 and 5. However, in FIG. 3, the data for each transformer is fully collapsed so that available data for any meters downstream therefrom is not shown. In FIGS. 3-5 colors are illustrated as different line patterns that represent corresponding colors, but the line patterns will be referred to as colors herein.

As shown in FIG. 3, Residential 1 and Residential 2 are both 50 kVA transformers, while Commercial 1 is a 100 kVA transformer. Residential 1 has a usage of 35.1 kWh and a metered usage of 33.1 kWh measured by 8 meters downstream therefrom. The status of Residential 1 is orange, which indicates a medium probability of electricity theft. Residential 2 has a usage of 29.6 kWh and a metered usage of 24 kWh measured by 5 meters. The status of Residential 2 is red, which indicates a high probability of electricity theft. The status of Residential 2 will be discussed further with respect to FIGS. 4 and 5 below. Commercial 1 has a usage of 87.4 kWh and a metered usage of 86.1 kWh measured by 4 meters downstream. The status of the Commercial 1 is green, which indicates no or essentially no probability of electricity theft.

Referring to FIGS. 4 and 5, the status of Residential 2 will be discussed in more detail in order to illustrate a non-limiting example of how GUI 84 displays data for monitored system components. FIG. 4 shows that the data for Residential 2 can be expanded to include data 92 for the meters downstream therefrom. Meter data 92 is displayed upon touching or clicking on the Residential 2 line in transformer section 90 on GUI 84. Residential 1 and Commercial 1 generally include the same meter data for their downstream meters. Meter data 92 includes the names of downstream meters, Meters 1-5; the usage of the meters measured in kWh; and the status of the meters. The usage for each of Meters 1-5, respectively, is 4.2 kWh, 8.5 kWh, 4.8 kWh, 3.9 kWh, and 2.6 kWh. When added together, the usage for Meters 1-5 equals the 24 kWh measured usage displayed for Residential 2. The status for Meters 1, 2, and 5 are green, which indicates no or essentially no probability of electricity theft. The status of Meter 4 is yellow, which indicates a slight probability of electricity theft. The status of Meter 3 is red, which indicates a high probability of electricity theft. In this case, the red status of Meter 3 controls the red status of Residential 2 to indicate that Meter 3 requires immediate attention even if the data for Meters 1-5 of Residential 2 is collapsed.

FIG. 5 shows a detailed explanation of the status of Meter 3 in a separate integrity checks window 94 displayed over the top of other data in transformer section 90 upon touching or clicking on the Meter 3 line in meter data 92 on GUI 84. Integrity checks window 94 displays all of the existing electricity theft indicators for Meter 3 and may be closed by touching or clicking on the "x" in its upper right-hand corner. Each of Meters 1, 2, 4, and 5 generally include a similar integrity checks window.

Integrity checks window 94 shows that Meter 3 has three existing electricity theft indicators. The first is an outage at Meter 3 with no outage at Residential 2. The second theft indicator is a discrepancy between the readings taken at Meter 3 and a sub-meter downstream from Meter 3. The second theft indicator was found as a result of the controller performing process 66 described above with respect to FIG. 2. As explained previously, the first and second theft indicators for Meter 3 are both high probability theft indicators, so a red status is displayed to the left of each theft indicator description.

The third electricity theft indicator for Meter 3 is a significant drop in usage, which is typically set to a 15% or more reduction in daily usage, but could be set to a different level depending on different circumstances or preferences. As set forth above, that type of electricity theft indicator is a slight probability indicator, so a yellow status is displayed to the left of its description. Since the integrity checks analysis found two high probability theft indicators and one slight probability theft indicator, the probability of electricity theft at Meter 3 is quite high. This is why the overall status for Residential 2 is indicated in red. Because that is the case, the utility will almost certainly send a lineman to investigate Meter 3. Based on the data for Meter 3 in integrity checks window 94, the lineman is likely to find that Meter 3 has been at least partially bypassed using a method such as, for example, the bypass method shown in FIG. 1.

As shown by way of the example on GUI 84 in FIGS. 3-5, the integrity checks analysis is useful in determining whether electricity is being stolen at a particular property, and the output of the analysis to GUI 84 is useful to alert the utility of the theft. The color-coded ranking system and organization of the data allows the utility to quickly understand the probability of electricity theft for every monitored system component and take the appropriate action such as, for example, sending a lineman to investigate system components or monitoring the status of particular components more closely in the future. It is important for utilities to have reliable indicators of electricity theft at specific locations in order to prevent the current losses amounting to billions of dollars.

Beneficially, embodiments of the invention thus provide a system for detecting electricity theft. The system includes a controller that receives electricity usage and demand data from a primary meter and a sub-meter and monitors changes in the measured demand data from the primary meter and the sub-meter and/or changes in demand data interpreted from the primary meter and sub-meter usage data over multiple intervals. If changes in the demand data from the sub-meter rise above a minimum threshold, the controller compares the changes in demand data from the sub-meter to corresponding changes in demand data from the primary meter measured at the same time. The controller then calculates a tamper percentage and/or coefficient that indicates how much the primary meter has been tampered with or bypassed. If a discrepancy exists between the demand data from the primary meter and the sub-meter, the tamper percentage and/or coefficient will indicate a percentage that the primary meter has been bypassed by a utility customer to reduce the electric utility bill.

Other embodiments of the invention provide that the system also includes a GUI that displays the results of an integrity checks analysis performed by the system controller. The system controller monitors or analyzes data from various meters and sensors on system components such as, for example, multiple transformers and primary meters. The data is analyzed to determine the probability that electricity theft is occurring at the system components. The system controller monitors for electricity theft indicators that designate a slight, medium, or high probability of theft. The controller ranks the indicators based on point system. The probability of theft determined by the controller based on the theft indicators for all monitored system components is then displayed on the GUI as a color according to a color-coded ranking system. The GUI displays the probability of theft as different colors in order to make it easy for the utility to take action.

According to one embodiment of the present invention, a system for detecting theft of electricity from a utility. The system includes a controller configured to receive electricity readings from an upstream metering device configured to sense electricity flowing therethrough and electricity readings from a first downstream metering device that is electrically downstream from the upstream metering device and configured to sense electricity flowing to a first load. The controller is further configured to compare the electricity readings from the first downstream metering device to the electricity readings from the upstream metering device. The controller is additionally configured to calculate a level of interference with an electrical path through the upstream metering device based on an extent that the electricity readings from the first downstream metering device deviate from the electricity readings from the upstream metering device and output to the utility the level of interference with the electrical path.

According to another embodiment of the present invention, a method of detecting theft of electricity includes acquiring electrical data for a primary load using a primary meter and electrical data for a secondary load downstream from the primary load using a sub-meter and transmitting the electrical data for the primary and secondary loads to a controller. In addition, the method includes analyzing the electrical data for the primary and secondary loads with the controller to detect if any of the secondary load electrical data conflicts with the corresponding primary load electrical data. Furthermore, the method includes assessing with the controller an extent of tampering with an electrical line through the primary meter to the primary load based on the analysis and outputting the extent of the tampering with the electrical line to a display.

According to yet another embodiment of the present invention, a power system having electrical theft detection capabilities includes a primary meter configured to measure a flow of electricity through an electrical path from an electric utility to a primary load and a control system for detecting theft of electricity. The control system configured to retrieve the electricity flow measurements of the primary meter and electricity flow measurements from at least one secondary meter electrically downstream from the primary meter, the at least one secondary meter configured to measure a flow of electricity to at least one secondary load and to compare changes in the electricity flow measurements of the primary meter to changes in the electricity flow measurements of the secondary meter taken at the same time. The control system is also configured to calculate a percentage of electricity that has bypassed the primary meter before being delivered to the primary load based on the comparison of changes in the electricity flow measurements of the primary meter to changes in the electricity flow measurements of the at least one secondary meter and to display the percentage on a graphical user interface.

The present invention has been described in terms of the preferred embodiment, and it is recognized that equivalents, alternatives, and modifications, aside from those expressly stated, are possible and within the scope of the appending claims.

What is claimed is:

1. A system for detecting theft of electricity from a utility, the system comprising a controller configured to:
   receive electricity readings from an upstream metering device configured to sense electricity flowing therethrough;
   receive electricity readings from a first downstream metering device that is positioned electrically downstream from the upstream metering device, between the upstream metering device and a first load, and configured to sense electricity flowing to the first load;
   compare the electricity readings from the first downstream metering device to the electricity readings from the upstream metering device;
   calculate a level of interference with an electrical path through the upstream metering device based on an extent that the electricity readings from the first downstream metering device deviate from the electricity readings from the upstream metering device; and
   output to the utility the level of interference with the electrical path.

2. The system of claim 1 wherein the controller is configured to use linear regression to calculate the level of interference with the electrical path.

3. The system of claim 1 wherein the controller is configured to output the level of interference with the electrical path as an interference coefficient equal to a value between 0 and 1.

4. The system of claim 1 wherein the controller is configured to output the level of interference with the electrical path to the utility on a graphical user interface using a color-coded system as part of an integrity checks analysis.

5. The system of claim 1 wherein the controller is configured to compare the electricity readings from the first downstream metering device to the electricity readings from the upstream metering device over multiple intervals.

6. The system of claim 1 wherein the controller is further configured to omit the comparison when a change in electricity demand sensed by the first downstream metering device is below a predetermined percentage of a maximum change in electricity demand sensed by the first downstream metering device.

7. The system of claim 1 wherein the upstream metering device comprises a primary meter for one of a residential and a commercial property; and
   the first downstream metering device comprises a sub-meter for a smart load.

8. The system of claim 1 wherein the controller is further configured to:
   receive electricity readings from a second downstream metering device that is electrically downstream from the upstream metering device and configured to sense electricity flowing to a second load;
   compare the electricity readings from the second downstream metering device to the electricity readings from the upstream metering device; and
   calculate the level of interference with the electrical path through the upstream metering device based on an extent that the electricity readings from the first and second downstream metering devices deviate from the electricity readings from the upstream metering device.

9. A method of detecting theft of electricity comprising:
   acquiring electrical data for a primary load using a primary meter and electrical data for a secondary load downstream from the primary load using a sub-meter;
   transmitting the electrical data for the primary and secondary loads to a controller;
   analyzing the electrical data for the primary and secondary loads with the controller to detect if any of the secondary load electrical data conflicts with the primary load electrical data;
   assessing with the controller an extent of tampering with an electrical line through the primary meter to the primary load based on the analysis; and outputting the extent of the tampering with the electrical line to a display.

10. The method of claim 9 wherein assessing the extent of the tampering with the electrical line comprises computing a tamper percentage indicating a percentage that the primary meter has been bypassed.

11. The method of claim 10 wherein computing the tamper percentage includes computing a linear regression slope based on the electrical data for the primary and secondary loads.

12. The method of claim 9 further comprising applying a deadband to the secondary load electrical data to filter out changes in demand in the secondary load electrical data below a threshold before analyzing the secondary and primary load electrical data.

13. The method of claim 12 wherein applying the deadband comprises:
   comparing an absolute value of the secondary load electrical data to the threshold; and
   filtering out the secondary electrical load data if the absolute value of the secondary load electrical data is less than the threshold.

14. The method of claim 9 further comprising outputting a color-coded notification to a graphical user interface indicating a probability of tampering with the electrical line.

15. A power system having electrical theft detection capabilities, the power system comprising:
   a primary meter configured to measure a flow of electricity through an electrical path from an electric utility to a primary load;
   a control system for detecting theft of electricity, the control system configured to:
      retrieve electricity flow measurements of the primary meter and electricity flow measurements of at least one secondary meter electrically downstream from the primary meter, the at least one secondary meter configured to measure a flow of electricity to at least one secondary load;
      compare changes in the electricity flow measurements of the primary meter to changes in the electricity flow measurements of the at least one secondary meter taken at the same time;
      calculate a percentage of electricity that has bypassed the primary meter before being delivered to the primary load based on the comparison of changes in the electricity flow measurements of the primary meter to changes in the electricity flow measurements of the at least one secondary meter; and
      display the percentage on a graphical user interface.

16. The power system of claim 15 wherein the control system is further configured to apply a deadband to the electricity flow measurements of the at least one secondary meter to filter out changes in demand in the electricity flow measurements of the at least one secondary meter below a predetermined threshold.

17. The power system of claim 15 wherein the control system is configured to compare changes in demand in the electricity flow measurements of the primary meter and the at least one secondary meter over multiple intervals.

18. The power system of claim 15 wherein the primary load comprises a residence; and
   wherein the at least one secondary load comprises a smart appliance.

19. The power system of claim 15 wherein the electricity flow measurements of the primary meter and the electricity flow measurements of the at least one secondary meter comprise power demand measurements.

20. The power system of claim 15 further comprising a transformer having a transformer meter configured to measure a flow of electricity through the electrical path from the electric utility to the primary meter; and
   wherein the control system is further configured to:
      retrieve electricity flow measurements of the transformer meter;
      compare the electricity flow measurements of the transformer meter to the electricity flow measurements of the primary meter and the at least one secondary meter;
      if a discrepancy exists between any of the electricity flow measurements of the transformer meter, primary meter, and the at least one secondary meter based on the comparison thereof, determine a probability that the discrepancy indicates theft of electricity; and
      display the probability as a color on the graphical user interface according to color-coded system.

* * * * *